(12) United States Patent
Chen et al.

(10) Patent No.: US 11,956,919 B2
(45) Date of Patent: Apr. 9, 2024

(54) COLD PLATE

(71) Applicant: AURAS TECHNOLOGY CO., LTD., New Taipei (TW)

(72) Inventors: Chien-An Chen, New Taipei (TW); Chien-Yu Chen, New Taipei (TW); Tian-Li Ye, New Taipei (TW); Jen-Hao Lin, New Taipei (TW); Wei-Shen Lee, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 585 days.

(21) Appl. No.: 17/132,207

(22) Filed: Dec. 23, 2020

(65) Prior Publication Data
US 2021/0392779 A1    Dec. 16, 2021

Related U.S. Application Data

(60) Provisional application No. 63/038,191, filed on Jun. 12, 2020.

(30) Foreign Application Priority Data

Oct. 21, 2020   (TW) .................................. 109136472

(51) Int. Cl.
*H05K 7/20* (2006.01)
*F28D 9/00* (2006.01)
*F28F 3/12* (2006.01)
*F28D 21/00* (2006.01)

(52) U.S. Cl.
CPC ....... *H05K 7/20254* (2013.01); *F28D 9/0068* (2013.01); *F28F 3/12* (2013.01); *F28D 2021/0028* (2013.01)

(58) Field of Classification Search
CPC ........... H01L 2924/0002; H01L 23/473; H01L 2924/002; H01L 2924/00; F04D 29/588; F04D 13/0606; G06F 1/20; G06F 1/206; F28D 2021/0029; H05K 7/20254; H05K 7/20263
See application file for complete search history.

(56) References Cited

U.S. PATENT DOCUMENTS

| | | | | |
|---|---|---|---|---|
| 7,688,589 B2* | 3/2010 | Chiang | ................. | H01L 23/473 415/176 |
| 2004/0052663 A1* | 3/2004 | Laing | ........................ | G06F 1/20 257/E23.098 |
| 2006/0171801 A1* | 8/2006 | Manabe | ................ | H01L 23/473 415/176 |
| 2006/0185829 A1* | 8/2006 | Duan | .................... | H01L 23/473 257/E23.098 |
| 2008/0075611 A1* | 3/2008 | Lai | ...................... | F04D 13/0606 417/420 |

\* cited by examiner

*Primary Examiner* — Tho V Duong
(74) *Attorney, Agent, or Firm* — Amin, Turocy & Watson, LLP

(57) ABSTRACT

A cold plate is provided and includes: a housing disposed with a chamber; a base combined with the housing to form a working space separated from the chamber but connected with the chamber through an interconnecting structure to allow a working medium to flow within the chamber and the working space; a heat transfer structure disposed on the inner side of the base; and a pump disposed within the working space to drive the working medium in the working space. As such, the cold plate can provide better heat dissipation performance.

16 Claims, 16 Drawing Sheets

COLD PLATE

BACKGROUND

1. Technical Field

The present disclosure generally relates to the heat dissipation field, and more specifically, to a cold plate.

2. Description of Related Art

In the face of modernization, computers and various electronic devices have seen rapid developments and continuously improved performance. However, along with these improvements, heat dissipation has become one of the major issues faced by high performance hardware today. In general, computers and various electronic devices employ heat dissipation components for dissipating the heat away. For example, a thermal paste or cooling fins can be attached onto an electronic component that is subjected to heat dissipation in order to absorb and disperse heat generated by the electronic component. However, heat dissipation effect provided by this type of heat dissipation method is limited. Heat dissipation modules that use liquids for cooling have thus been developed.

Existing liquid cooling heat dissipation modules typically uses coolants for absorbing thermal energy. For example, after allowing a coolant to flow through an electronic component subject to heat dissipation, the heated coolant can then flow to a place with a lower temperature in order for heat exchange to take place. After heat is exchanged, the coolant can return to the electronic component subject to heat dissipation to absorb more thermal energy, thereby creating a circulation for heat dissipation.

However, when a plurality of the existing heat dissipation modules are connected together in series, bypass of the coolant may occur, which adversely influences the overall heat dissipation capacity of the heat dissipation modules and temperature uniformity of the system. In addition, pump failure in the existing heat dissipation modules may cause the whole system to stop functioning. Moreover, heat dissipation fins in the existing heat dissipation modules may encounter the problem of having an inflow water pressure that is too low.

Therefore, there is a need in the art to provide a cold plate that effectively addresses the aforementioned shortcomings.

SUMMARY

The present disclosure is to provide a cold plate, which may include a housing provided with a chamber; a base combined with the housing to form a working space separated from the chamber and connected to the chamber and the working space via an interconnecting structure to allow a working medium to flow in the chamber and the working space; a heat transfer structure disposed on an inner side of the base for transferring thermal energy created by a heat source in contact with an outer side of the base to the working medium in the working space; and a first pump disposed in the working space for partitioning the working space into a heat absorption space and a drainage space and for driving the working medium to flow from the heat absorption space to the drainage space.

The cold plate above may further include a second pump disposed in the chamber for driving the working medium to flow from the chamber to the heat absorption space via the interconnecting structure.

The cold plate above may further include a baffle disposed between the base and the housing for jointly forming the chamber with the housing, wherein the second pump is disposed on the baffle.

In the cold plate above, the baffle may include a diversion groove and the interconnecting structure, the diversion groove is formed on the baffle and one end of which is located at the tangent direction of an edge of the second pump, and the interconnecting structure is located at other end of the diversion groove and penetrates through the baffle.

In the cold plate above, the diversion groove may be formed by sidewalls protruding from a surface of the baffle, or formed by a groove recessed into the surface of the baffle.

In the cold plate above, the baffle may further include a connecting portion and a shaft fastening portion on which the second pump is disposed, the shaft fastening portion may be located at a center of the connecting portion for securing a shaft of the second pump, and the connecting portion may include a recessed cross-shaped groove for guiding the working medium.

The cold plate above may further include a ring piece provided between the second pump and the cross-shaped groove, wherein a portion of the cross-shaped groove may be exposed from the ring piece and the connecting portion.

The cold plate above may further include a Mylar ring piece provided between the second pump and the shaft fastening portion, wherein the ring piece and the connecting portion may be integrally formed.

The cold plate above may further include a retaining wall provided on the baffle to partition the chamber into at least two spaces, wherein the second pump, the diversion groove, the interconnecting structure, the connecting portion, and the shaft fastening portion may all be located in one of the at least two spaces.

In the cold plate above, the housing may further include a pump chamber and a circular sidewall provided at periphery of the pump chamber, the pump chamber may be configured for receiving the second pump, and the circular sidewall may be configured for separating the pump chamber and the chamber and being fluidly connected with the cross-shaped groove and the diversion groove after the housing is combined with the baffle.

In the cold plate above, the base may further include a connecting portion and a shaft fastening portion on which the first pump is disposed, the shaft fastening portion is located at a center of the connecting portion for securing a shaft of the first pump, and the connecting portion may include a plurality of recessed grooves for guiding the working medium.

In the cold plate above, the plurality of grooves may be arranged at equal angles, and one of the plurality of grooves may extend in parallel with an extending direction of the heat transfer structure.

The cold plate above may further include a ring piece provided between the first pump and the plurality of grooves.

The cold plate above may further include a Mylar ring piece provided between the first pump and the shaft fastening portion, wherein the ring piece and the connecting portion may be integrally formed and through which the plurality of grooves penetrate.

The cold plate above may further include a plurality of channels, wherein one of the plurality of channels may be interconnected with the drainage space, while rest of the plurality of channels may be interconnected with the chamber.

In the cold plate above, the heat transfer structure may include a plurality of fins, and the interconnecting structure may be correspondingly located at one end of the plurality of fins, and the first pump may be correspondingly located at other end of the plurality of fins.

The cold plate above may further include a recess formed on the inner side of the base corresponding to periphery of the heat transfer structure, wherein the recess receives the working medium flowing through the interconnecting structure.

DETAILED DESCRIPTION

Embodiments of the present disclosure are illustrated with specific implementations. Other advantages and technical effects of the present disclosure can be readily understood by one with ordinary skill in the art upon reading the disclosure provided herein, and can be used or applied in other different implementations.

The cold plate provided by the present disclosure can be installed in an electronic device, such as a computer mainframe or a server. A working medium (e.g., a coolant) can be filled inside the cold plate. Thermal energy generated by a heat source (e.g., an electronic component such as a chip or a memory) can be absorbed by the working medium. The heated working medium can be transferred to a cooling device for cooling. The cooled working medium can then be transferred back to the cold plate for the next round of heat absorption and circulation flow.

Figure 1A:
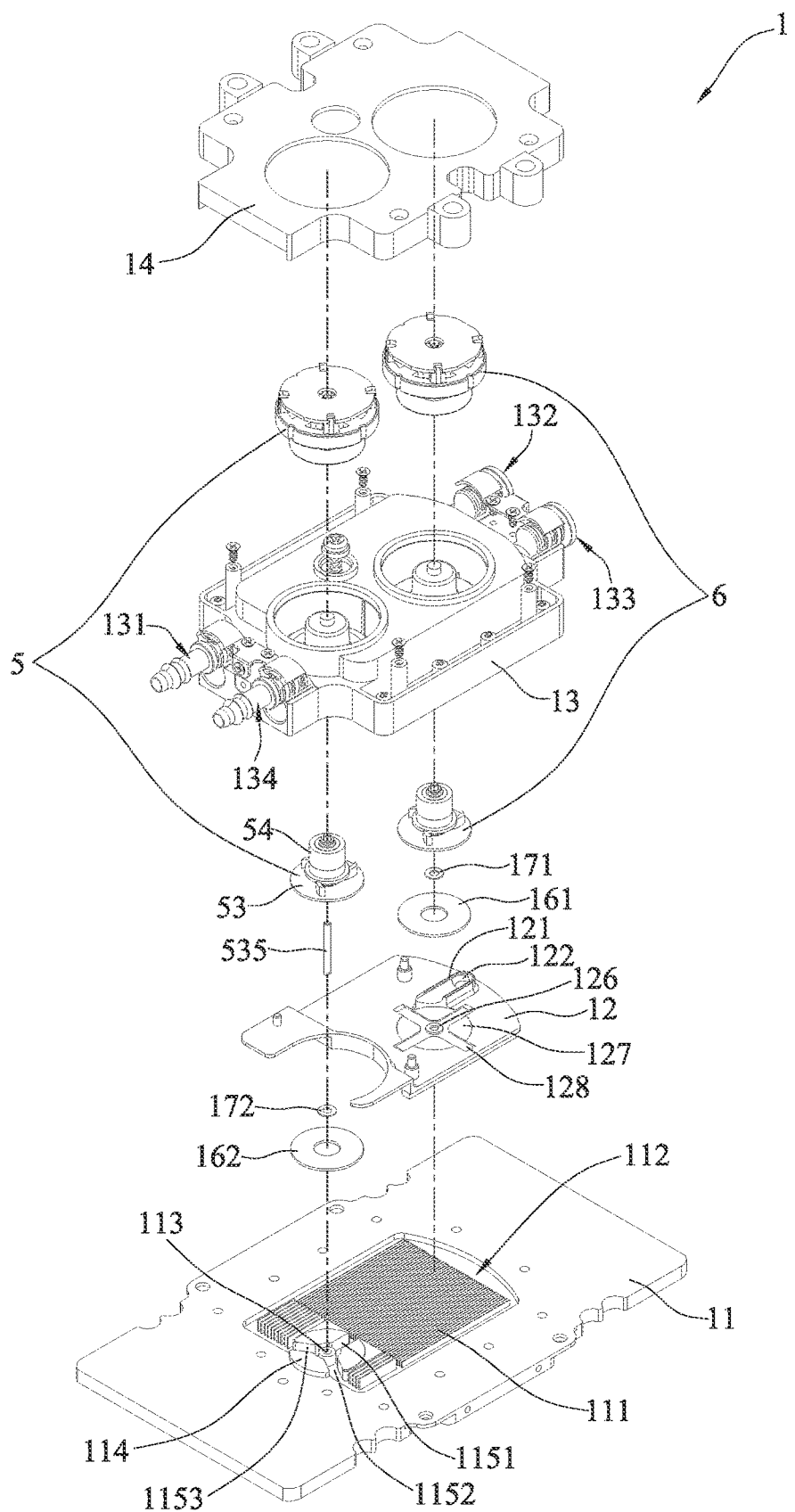
FIG. 1A is an exploded schematic view of a cold plate in accordance with the present disclosure.
Figure 2A:
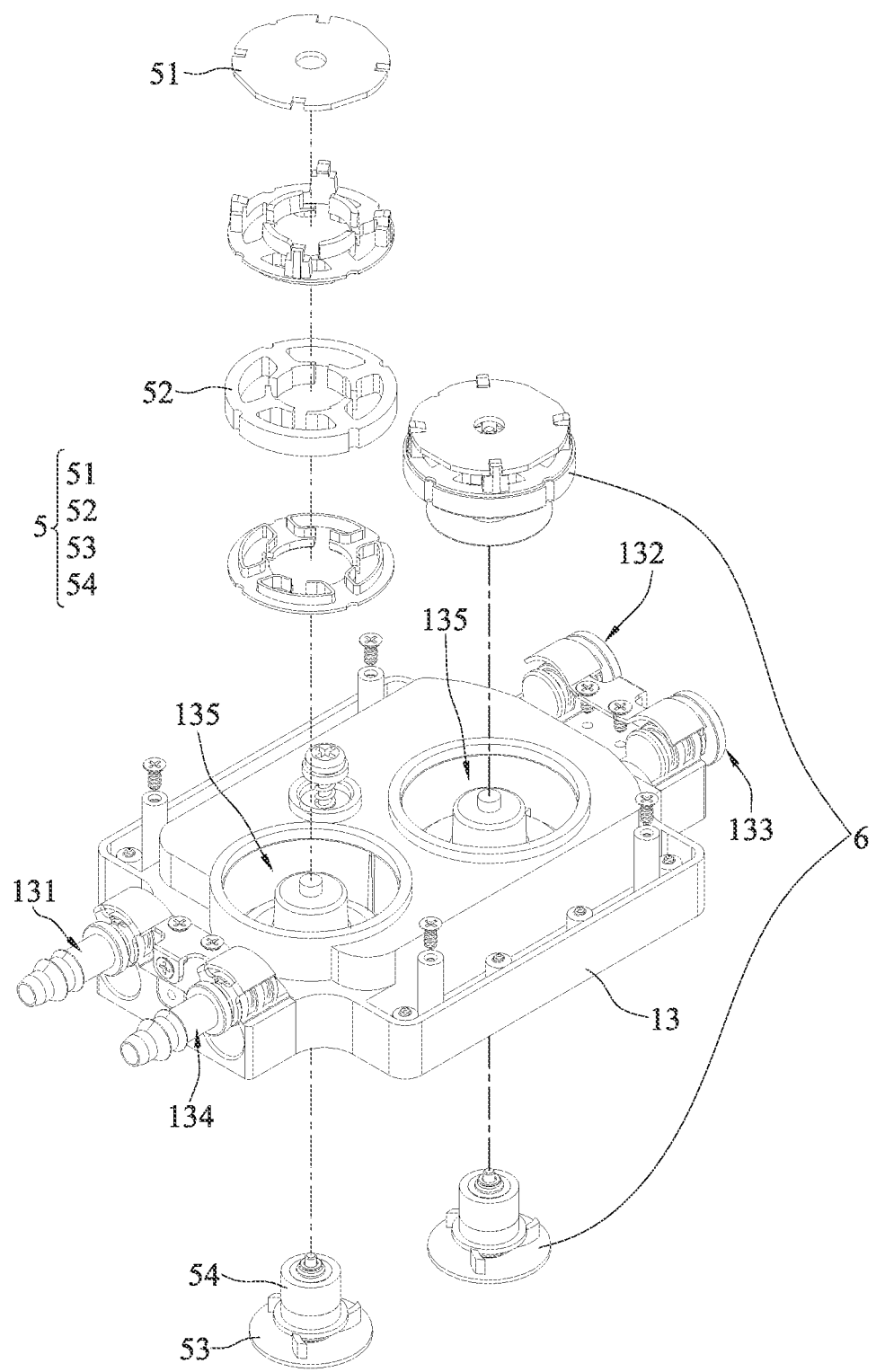
FIG. 2A is a schematic view of a housing and pumps combined together in a cold plate in accordance with the present disclosure.
Figure 11:
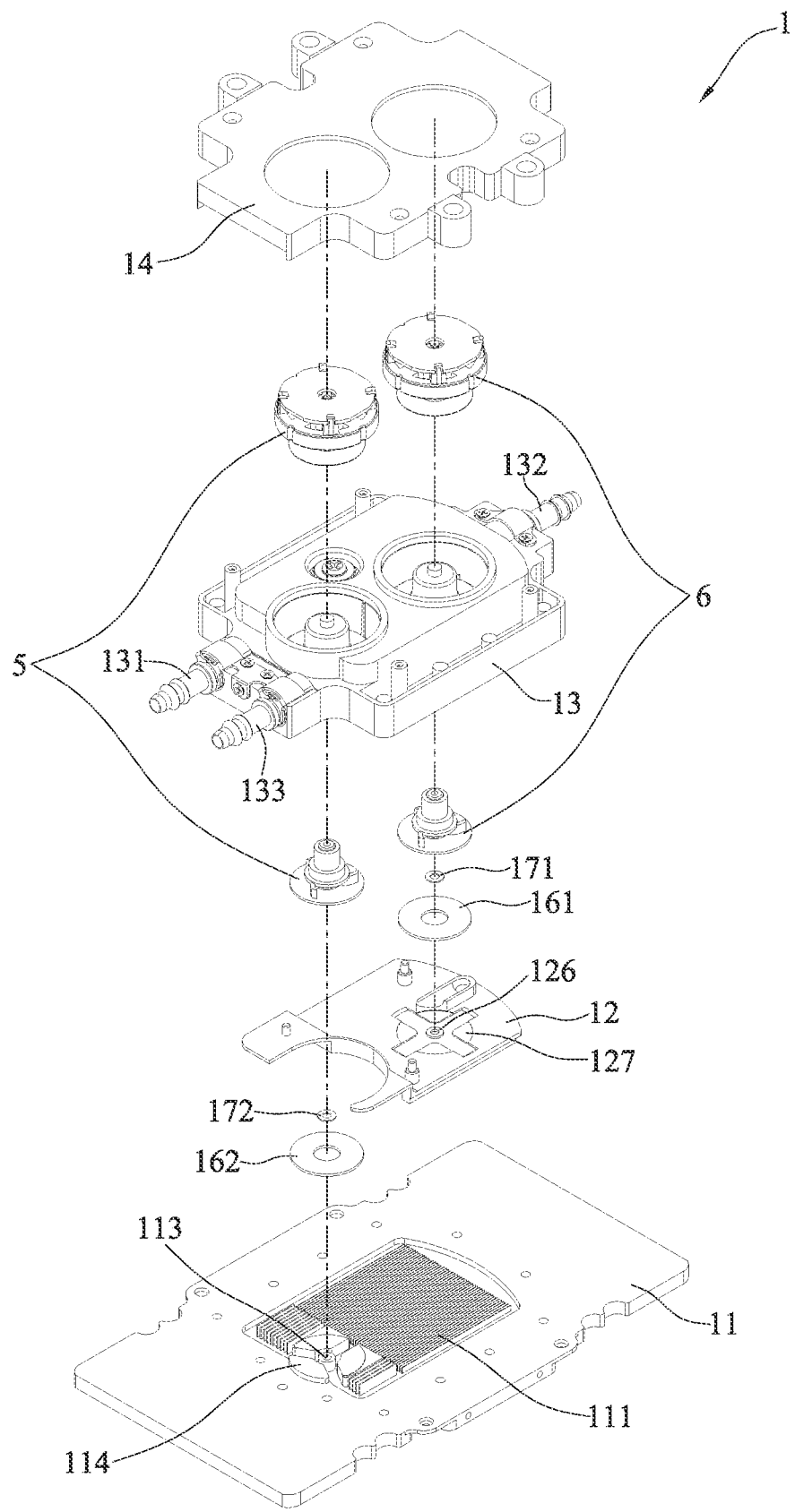
FIG. 11 is an exploded schematic view of still another embodiment of the cold plate in FIG. 1.

Referring to FIGS. 1A and 2A, a cold plate 1 in accordance with the present disclosure includes a cover 14, a housing 13, a baffle 12, a base 11, and pumps 5, 6. The housing 13 may act as the main structure member of the cold plate 1. The housing 13 can be combined with the cover 14 at a top thereof, and combined with the base 11 at a bottom thereof. Channels 131, 132, 133, 134 can be formed on sides of the housing 13. The combinations of the housing 13 with the various parts can be achieved by forming fastening structures (e.g., screw holes, studs and clips) on different parts of the housing 13 to facilitate assembly of the various parts by fastening, but the present disclosure is not limited to this type of combination. It should be noted that FIG. 1A depicts a design with four openings (channels 131, 132, 133, 134) in the cold plate 1 in accordance with the present disclosure, but the cold plate 1 in accordance with the present disclosure may also have a design of three openings (channels 131, 132, 133), such as that shown in FIG. 11, and the present disclosure is not limited as such.

In an embodiment, the housing 13 can structurally define with different chambers, including electromechanical chambers 135 and pump chambers 136, 137 (see FIG. 9), wherein the electromechanical chambers 135 open at the top side of the housing 13 and are independent from the flow path of the working medium in the cold plate 1. As such, electrical components provided inside the electromechanical chambers 135 can be protected, and the working medium is prevented from entering into the electromechanical chamber 135 to cause short circuits. In addition, the pump chambers 136, 137 open at the bottom side of the housing 13 and are situated on the flow path of the working medium in the cold plate 1. Some of the components of the pumps 5, 6 are respectively received inside the pump chambers 136, 137 for driving the flow of the working medium.

Figure 9:
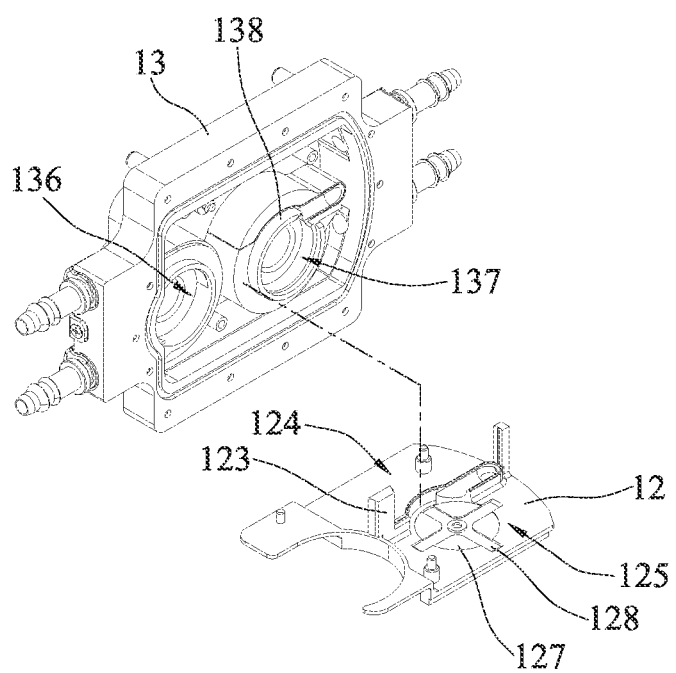
FIG. 9 is a schematic view of a housing and a baffle combined together in a cold plate in accordance with the present disclosure.

In an embodiment, the pump 5 and the pump 6 have the same structure, and the description is set forth below using the pump 5 as an example, and description on the structure of the pump 6 is not repeated. The pump 5 includes a circuit board 51, a first magnetic component 52, an impeller 53 and a second magnetic component 54, wherein the circuit board 51 and the first magnetic component 52 are disposed in the electromechanical chamber 135, whereas the impeller 53 and the second magnetic component 54 are disposed in the pump chamber 136 (as shown in FIG. 9), and wherein the power required for operations of the pump 5 can be provided by the circuit board 51 through, for example, a wired connection (not shown) using wires, or other wireless connections, such as electromagnetic induction with a power supply (not shown). In an embodiment, the circuit board 51 and the first magnetic component 52 are separated from the impeller 53 and the second magnetic component 54 by the housing 13, but the first magnetic component 52 and the second magnetic component 54 are coaxially provided. In an embodiment, the first magnetic component 52 and the second magnetic component 54 can be selected from magnets or other materials that can be driven or attracted by magnetic fields. In addition, the second magnetic component 54 and the impeller 53 are combined together, such that when the pump 5 is energized, the impeller 53 connected to the second magnetic component 54 can then be driven into rotations as a result of the joint actions between the circuit board 51, the first magnetic component 52 and the second magnetic component 54, which guides the working medium to create a flow.

In an embodiment, the base 11 is used for absorbing thermal energy. The material of the base 11 can be selected from metals or other materials with good thermal conductivities. Structurally, the base 11 can be a one-piece (integral) structure, or it can be a composite structure with a plurality of layers or a plurality of components, and the present disclosure is not limited as such. The outer side of the base 11 (i.e., the side distal to the housing 13) can be in direct or indirect contact with the heat source, and the inner side of the base 11 (i.e., the side facing the housing 13) is formed (or provided) with a heat transfer structure 111. Once the thermal energy produced by the heat source is absorbed by the outer side of the base 11, it is transferred to the heat transfer structure 111 on the inner side of the base 11. The heat transfer structure 111 will then transfer the thermal energy to the working medium through contact with the working medium.

In an embodiment, the heat transfer structure 111 of the base 11 can be skived fins or other columnar, sheet-like or irregularly shaped fins, as long as they increase the contact area with the working medium to allow thermal energy to be transferred more rapidly to the working medium. The present disclosure is not limited to the structure of the heat transfer structure 111 shown herein.

Figure 6A:
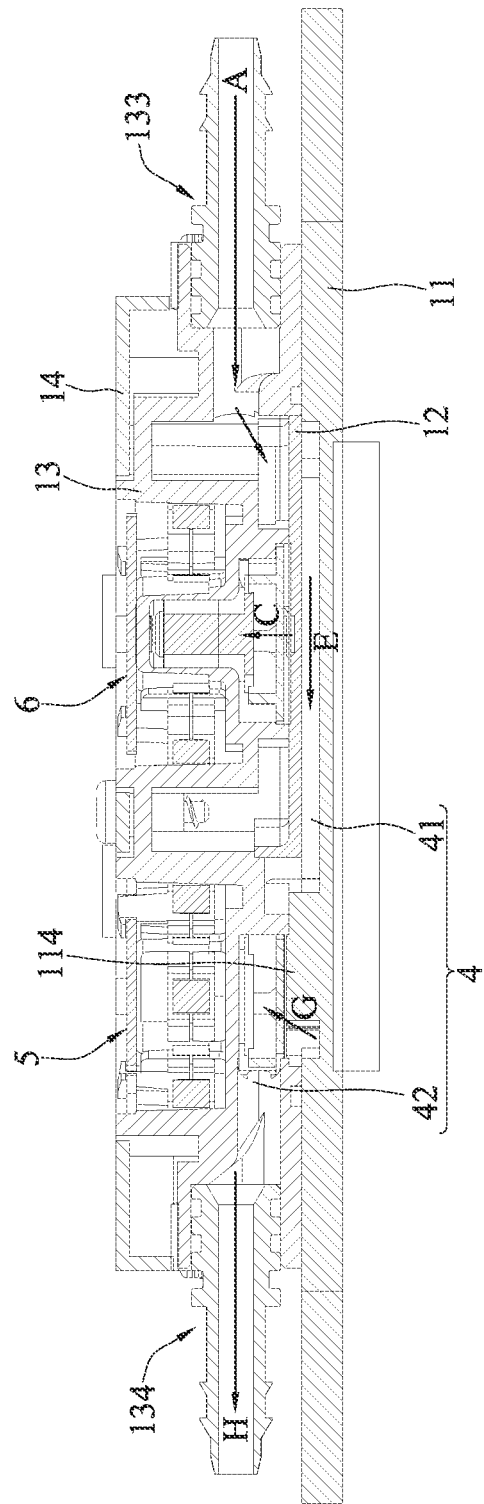
FIGS. 6A to 6C are schematic cross-sectional views of FIG. 5 along lines A to C, respectively.
Figure 6B:
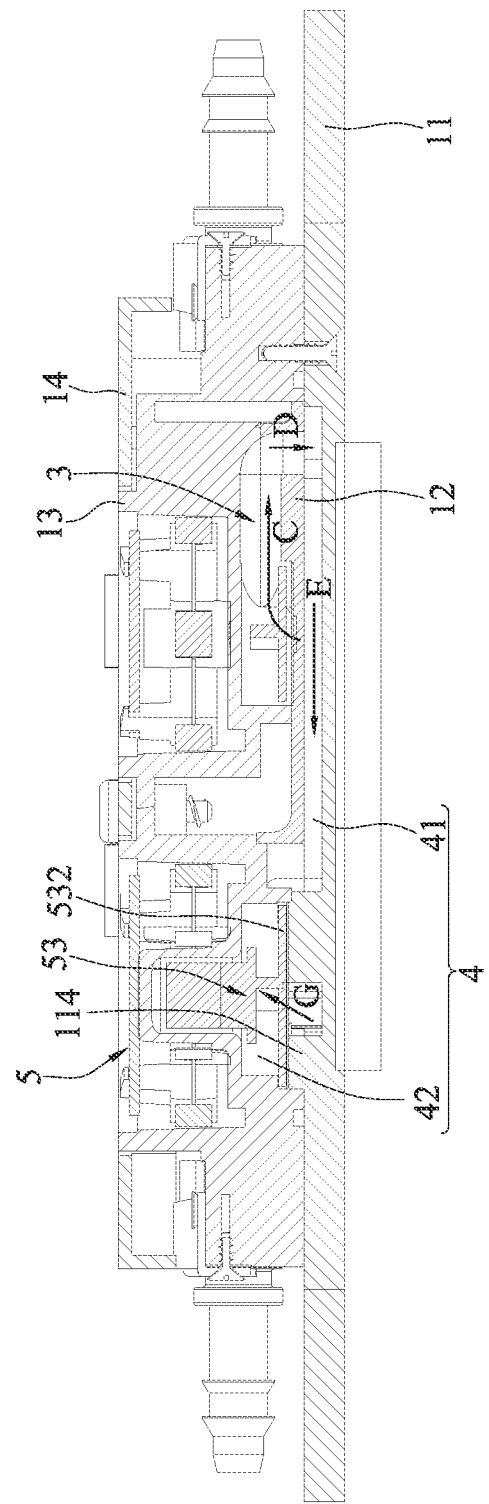
Figure 6C:
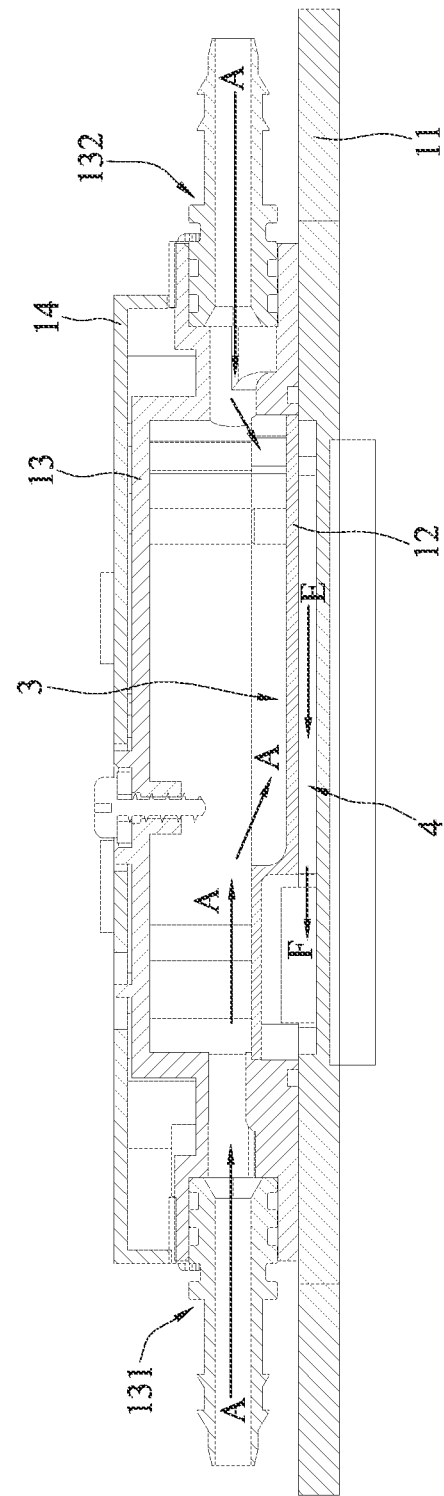

Referring to FIG. 6A to FIG. 6C, when the base 11 is combined with the housing 13, and the baffle 12 is disposed between the base 11 and the housing 13, a chamber 3 can be defined between the housing 13 and the baffle 12, and a working space 4 separated from the chamber 3 can be defined jointly by the base 11, the baffle 12 and the housing 13. The working space 4 is filled with the working medium and allows the working medium to flow therein. In an embodiment, the working space 4 can be partitioned into a heat absorption space 41 and a drainage space 42 by the impeller 53 of the pump 5 (e.g., a base plate 532, see FIG. 2B) without depending on other components, such as walls or partitions, thereby simplifying the internal structure of the cold plate 1.

In an embodiment, the working medium can be drawn directly from the heat absorption space 41 to the drainage space 42 by the impeller 53. In addition, the channel 134 is interconnected with the drainage space 42, so heated working medium can be transferred to the outside of the cold plate 1 for cooling.

Figure 2B:
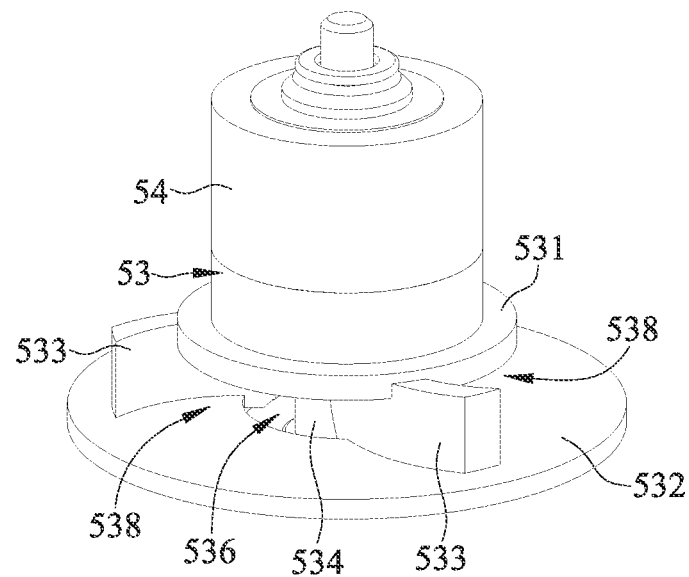
FIGS. 2B and 2C are schematic perspective views of pumps in a cold plate in accordance with the present disclosure seen from different angles.
Figure 2C:
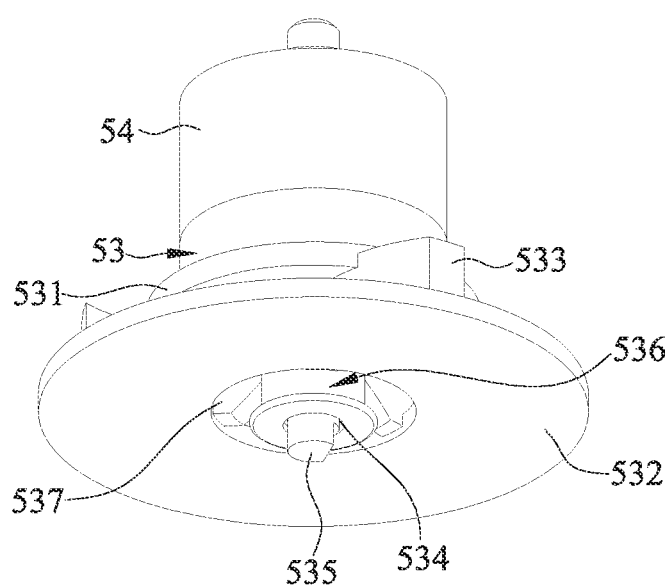

The overall structure of the impeller 53 of the pump 5 in the cold plate 1 of the present disclosure is now further explained in detail with reference to both FIGS. 2B and 2C. As described before, the working space 4 inside the cold plate 1 of the present disclosure is partitioned into the heat absorption space 41 and the drainage space 42 by the impeller 53 of the pump 5. Therefore, the impeller 53 itself has dual functions of drawing the working medium and expelling the working medium. In order to achieve these functionalities, the impeller 53 is disposed in the working space 4 and in proximity to the channel 134, such that the working medium can be drawn directly from the heat absorption space 41 into the drainage space 42 before being discharged out of the cold plate 1 via the channel 134. The impeller 53 includes a top piece 531, a base plate 532, vanes 533, a bushing 534 and a shaft 535, wherein a hollow portion 536 is formed between the base plate 532 and the bushing 534, and the base plate 532 and the bushing 534 can be connected through at least one rib 537 in the hollow portion 536. The partitioning of the working space 4 into the heat absorption space 41 and the drainage space 42 is mainly attributed to the base plate 532 in the impeller 53. Fluid coupling between the heat absorption space 41 and the drainage space 42 is achieved through the hollow portion 536, in other words, the working medium can flow into the drainage space 42 from the heat absorption space 41 through the hollow portion 536. The top piece 531 and the base plate 532 are spaced apart by a plurality of vanes 533 connected therebetween, thereby forming a plurality of drainage chambers 538. In the process of delivering the working medium upwards from the heat absorption space 41 into the drainage space 42 via the hollow portion 536, the working medium first comes into contact with the top piece 531 and gets deflected to the various drainage chambers 538. The working medium in each of the drainage chambers 538 is then spun into the channel 134 by the centrifugal force before being discharged out of the cold plate 1. The top piece 531 of the impeller 53 not only has the guiding function of changing the flow of the working medium, but also prevents the vanes 533 from coming into direct contact with the housing 13, thereby reducing the chance of wear.

In an embodiment, the impeller 53 is driven by electromagnetic induction between the first magnetic component 52 and the second magnetic component 54, not by the shaft 535. Thus, there is no linkage between the impeller 53 and the shaft 535. However, in order to maintain the durability and stability of the impeller 53 so that it does not rotate off axis or touch the housing 13 and cause wear during rotation, the bushing 534 having a hollow structure is thus provided inside the impeller 53 and sheathed onto the shaft 535. In addition, in order to secure the shaft 535 in place, one end of the shaft 535 can be disposed in a blind hole of the pump chamber 136 at the top of the working space 4 (i.e., the inner side of the housing 13), while the other end thereof can be disposed on a shaft fastening portion 113 (e.g., a blind hole) positioned in the center of a connecting portion 114 of the base 11, such that the pump 5 as a whole can be disposed on the connecting portion 114 of the base 11.

In an embodiment, considering the material of the impeller 53 itself, a shaft tube (not shown) can be further disposed and secured inside the bushing 534 if needed. The shaft tube is co-axially provided with the bushing 534 and the shaft 535, and is disposed between the bushing 534 and the shaft 535. The shaft tube can be made of an anti-wear or a durable material to reduce wear and tear during rotations of the impeller 53 relative to the shaft 535, thereby extending the life of the impeller 53. In another embodiment, a Mylar ring piece 172 can be further provided between the impeller 53 of the pump 5 and the shaft fastening portion 113. The Mylar ring piece 172 can be selected from an anti-wear or a durable material to reduce wear and tear during rotations of the shaft 535 of the impeller 53 on the shaft fastening portion 113, extending the life of the shaft 535.

In an embodiment, the inner side of the base 11 can be recessed and formed a recess 112, such that the heat transfer structure 111 can be formed within the recess 112, at the same time, the recess 112 is located at the periphery of the heat transfer structure 111, and the connecting portion 114 can be similarly located within the recess 112 at one end of the heat transfer structure 111. The recess 112 can be used for receiving the working medium. In an embodiment, the connecting portion 114 itself can include a plurality of grooves 1151, 1152, 1153 for guiding the working medium. Specifically, the plurality of grooves 1151, 1152, 1153 are arranged at equal angles (e.g., 120 degrees), and the extending direction of the groove 1151 can be parallel to the extending direction of the fins of the heat transfer structure 111, so that the groove 1151 can directly receive the working medium flowing from the heat transfer structure 111. In addition, the grooves 1152, 1153 can be used to receive the working medium that did not flow into the groove 1151 and is still in the recess 112.

Figure 1B:
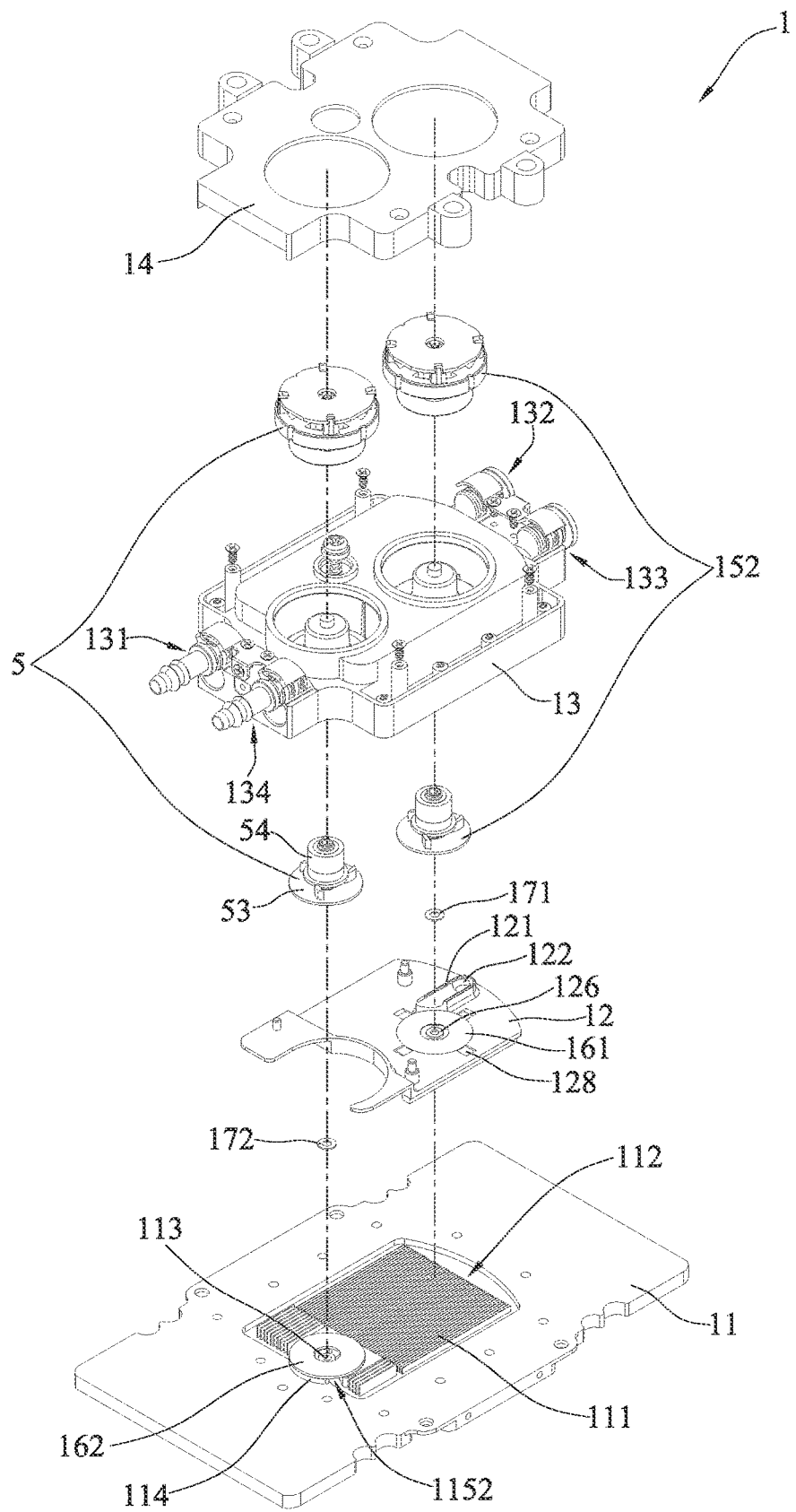
FIG. 1B is an exploded schematic view of another embodiment of the cold plate in accordance with the present disclosure.

In an embodiment, a ring piece 162 can be provided between the pump 5 and the plurality of grooves 1151, 1152, 1153 of the connecting portion 114. The ring piece 162 allows the working medium to be effectively guided into the plurality of grooves 1151, 1152, 1153, and ensures that the working medium flows to the center of the connecting portion 114 before it is drawn up to the drainage space 42 via the hollow portion 536 by the pump 5 to prevent backflow of the working medium and allow the working medium enters into the pump 5 in a more concentrated manner. In other embodiments, as shown in FIG. 1B, the ring piece 162 and the connecting portion 114 are formed integrally, and a plurality of grooves 1151, 1152, 1153 penetrate through the connecting portion 114, but the present disclosure does not limit the specific implementation of the connecting portion 114.

In an embodiment, the baffle 12 can be provided between the housing 13 and the base 11. The chamber 3 is formed jointly by the baffle 12 and the housing 13 (see FIGS. 6B and 6C), and the chamber 3 can be physically separated from the working space 4 but the chamber 3 and the working space 4 are connected through an interconnecting structure on the baffle 12. This interconnecting structure can be, for example, an opening 122 formed on the baffle 12. The chamber 3 can also be connected with the channels 131, 132, 133, so that the working medium flows into the chamber 3 through the channels 131, 132, 133, thereby making sure that the supply of the working medium in the cold plate 1 will not be interrupted.

In an embodiment, a diversion groove 121, a connecting portion 127, and a shaft fastening portion 126 positioned in the center of the connecting portion 127 can be formed on the surface of the baffle 12 facing the chamber 3. The pump 6 can be received in the pump chamber 137 of the housing 13 and disposed on the connecting portion 127 and the shaft fastening portion 126 of the baffle 12. The diversion groove 121 has an elongated shape with one end located at the tangent direction of an edge of the pump 6 and the other end connected with the interconnecting structure (i.e., the opening 122). The opening 122 penetrates through the baffle 12. The role of the pump 6 in the chamber 3 is to drive the working medium from the chamber 3 to the heat absorption space 41 between the base 11 and the baffle 12 via the opening 122.

In an embodiment, the diversion groove 121 can be an elongated groove formed from sidewalls protruding from the surface of the baffle 12. In another embodiment, the diversion groove 121 can also be an elongated groove formed from an indented groove in the surface of the baffle 12. The present disclosure does not limit the specific implementation of the diversion groove 121 as long as the working medium guided by the diversion groove 121 will only flow into the heat absorption space 41 via the opening 122 without flowing back to the chamber 3.

In an embodiment, the shaft fastening portion 126 (e.g., a blind hole) is used for securing one end of the shaft of the pump 6, and the other end of the shaft of the pump 6 is arranged in the blind hole in the pump chamber 137, such that the pump 6 as a whole can be disposed on the connecting portion 127 of the baffle 12. In addition, the connecting portion 127 can include a recessed groove 128 (e.g., a cross-shaped groove) for guiding the working medium. A Mylar ring piece 171 can be provided between the pump 6 and the shaft fastening portion 126, and a ring piece 161 can be provided between the pump 6 and the groove 128. The Mylar ring piece 171 and the ring piece 161 function in the same way as the Mylar ring piece 172 and the ring piece 162 described before, and will not be further discussed.

Figure 2D:
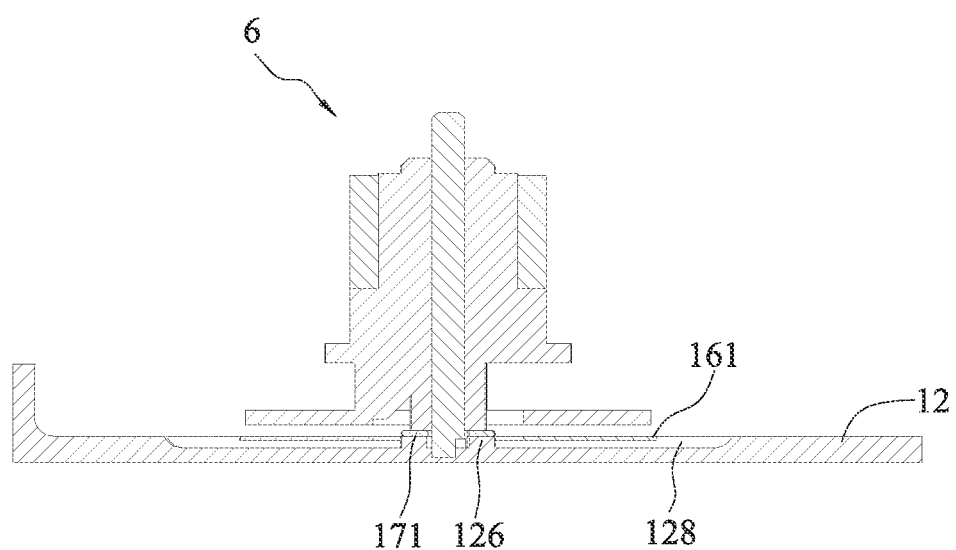
FIG. 2D is a schematic partial cross-sectional view of pumps and a baffle in a cold plate in accordance with the present disclosure.
Figure 3:
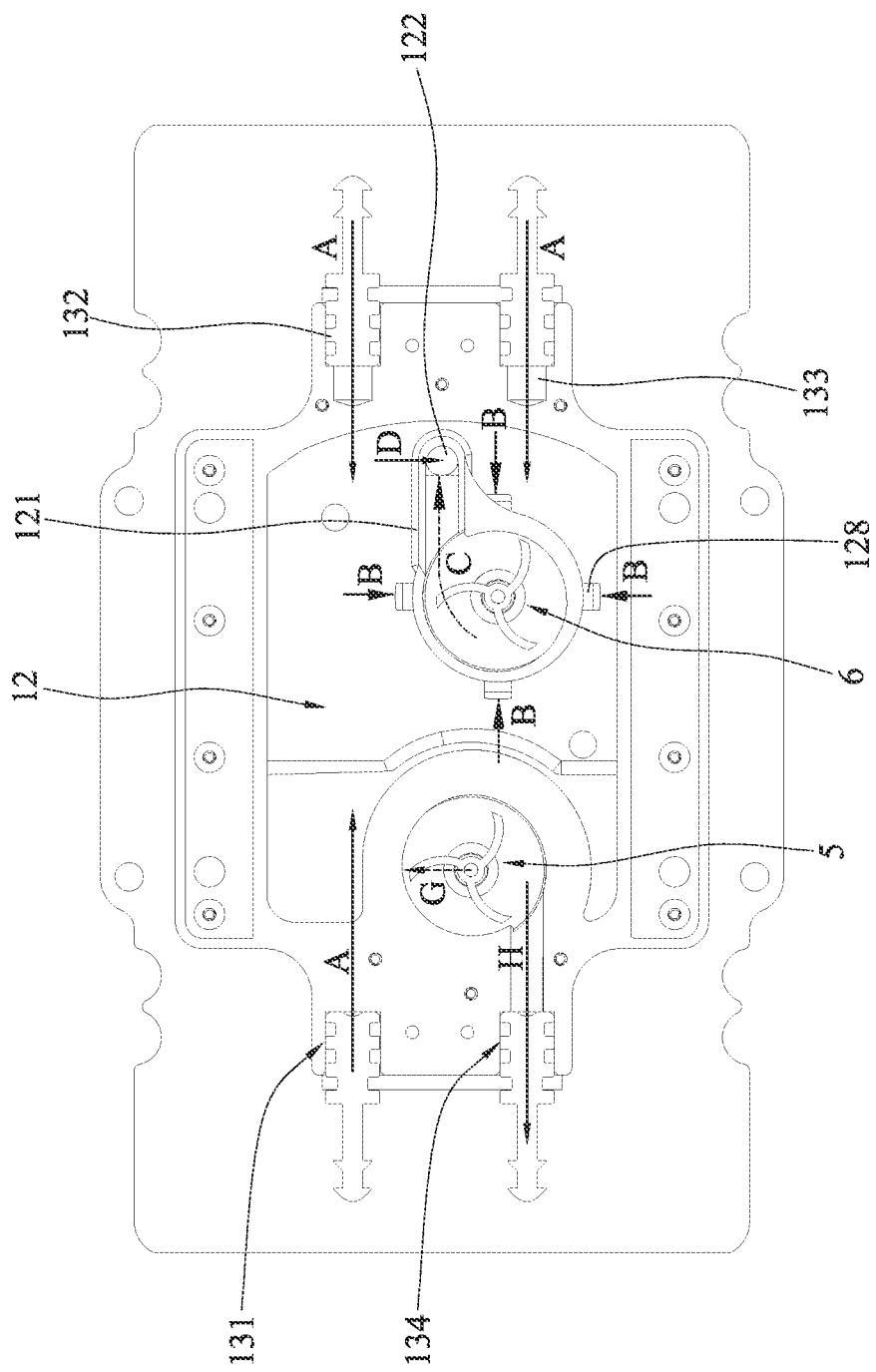
FIGS. 3 and 4 are schematic views depicting the flow of a coolant in a cold plate in accordance with the present disclosure.
Figure 4:
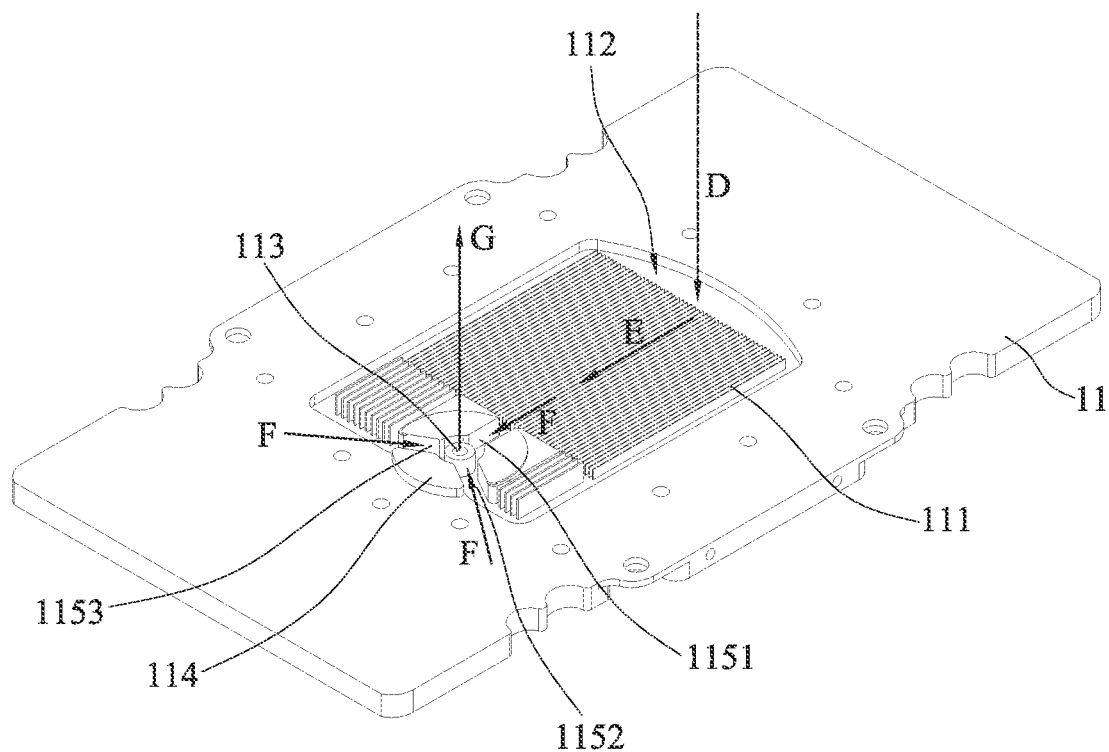
Figure 5:
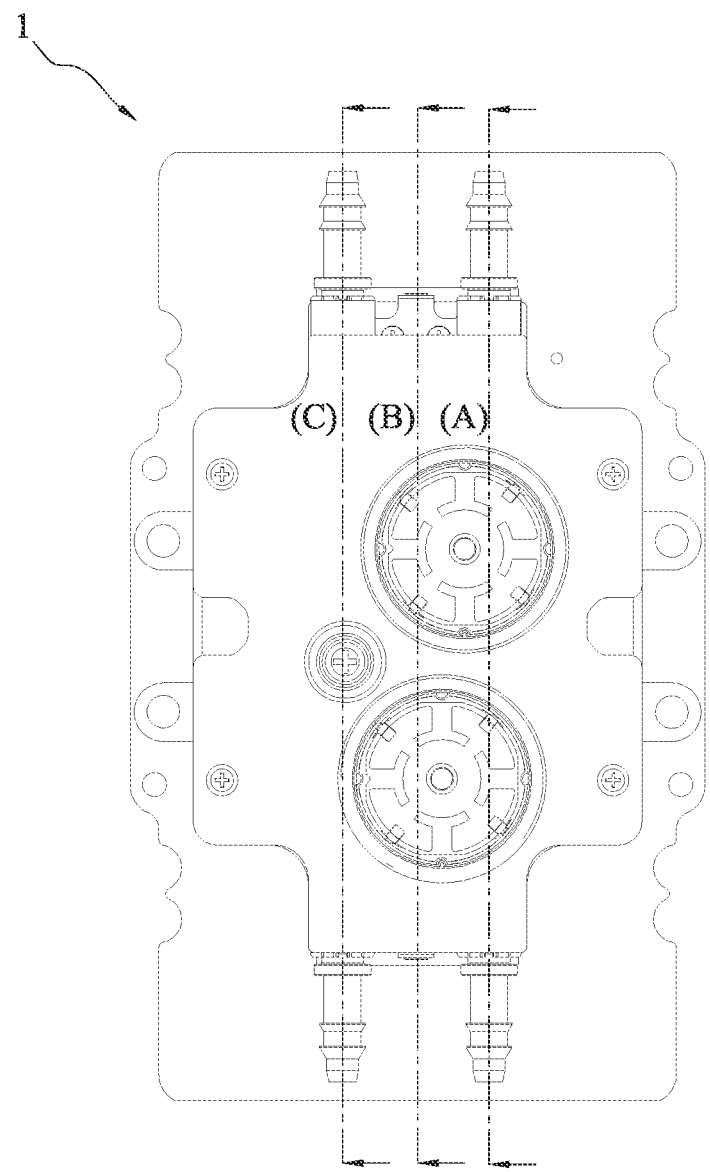
FIG. 5 is a top view of a cold plate in accordance with the present disclosure.

In an embodiment, as shown in FIG. 1B, the ring piece 161 and the connecting portion 127 are integrally formed, and the groove 128 penetrates through the connecting portion 127. In an embodiment, regardless of the implementations of the ring piece 161 and the connecting portion 127, a portion of the groove 128 is exposed from the ring piece 161 (as shown in FIG. 2D) and the connecting portion 127 (as shown in FIG. 1A) to allow the working medium to flow into it. The role of the groove 128 is such that the working medium is restricted to flow into the pump 6 only via the groove 128, and cannot flow into the pump 6 in other ways. Moreover, the ring piece 161 prevents backflow of the working medium, so that the working medium can enter the pump 6 in a more concentrated manner.

In an embodiment, the ring pieces 161, 162 can be made of plastic or a metal.

In yet another embodiment, as shown in FIG. 9, a circular sidewall 138 can be provided at the periphery of the pump chamber 137 of the housing 13. After the housing 13 is joined with the baffle 12, the pump chamber 137 and the chamber 3 are separated by the circular sidewall 138, so that the working medium driven by the pump 6 can only flow into the pump chamber 137 via the groove 128 and then into the diversion groove 121, and it cannot enter the pump chamber 137 in other ways.

Referring to FIGS. 3, 4, 5, 6A to 6C, the working principle of the cold plate 1 of the present disclosure is explained. A working medium entering the cold plate 1 can flow into the chamber 3 through the channels 131, 132, 133 along the directions of arrows A. In an embodiment, only one of the channels 131, 132, 133 is selected for inflow of the working medium, or a plurality of the channels 131, 132, 133 can also be selected for inflow of the working medium, and the present disclosure is not limited as such. Channels that are not used as inlets of the working medium can be sealed off. Then, the working medium flowing into the chamber 3 can flow into the pump 6 via the groove 128 along the directions of arrows B. Driven by the pump 6, the working medium is guided from the pump 6 into the diversion groove 121 along the direction of an arrow C. The working medium can then flow into the heat absorption space 41 via the opening 122 along the direction of an arrow D and arrive at the recess 112 of the base 11. Next, the working medium passes through the inside of the heat transfer structure 111 along the direction of an arrow E while absorbing thermal energy absorbed by the heat transfer structure 111, and flows into the grooves 1151, 1152, 1153 along the directions of arrows F. Finally, driven by the pump 5, the working medium is drawn from the heat absorption space 41 to the drainage space 42 by the pump 5 along the direction of an arrow G, and is then discharged out of the cold plate 1 via the channel 134 connected with the drainage space 42 along the direction of an arrow H (the tangent direction of an edge of the pump 5) for cooling.

Figure 7:
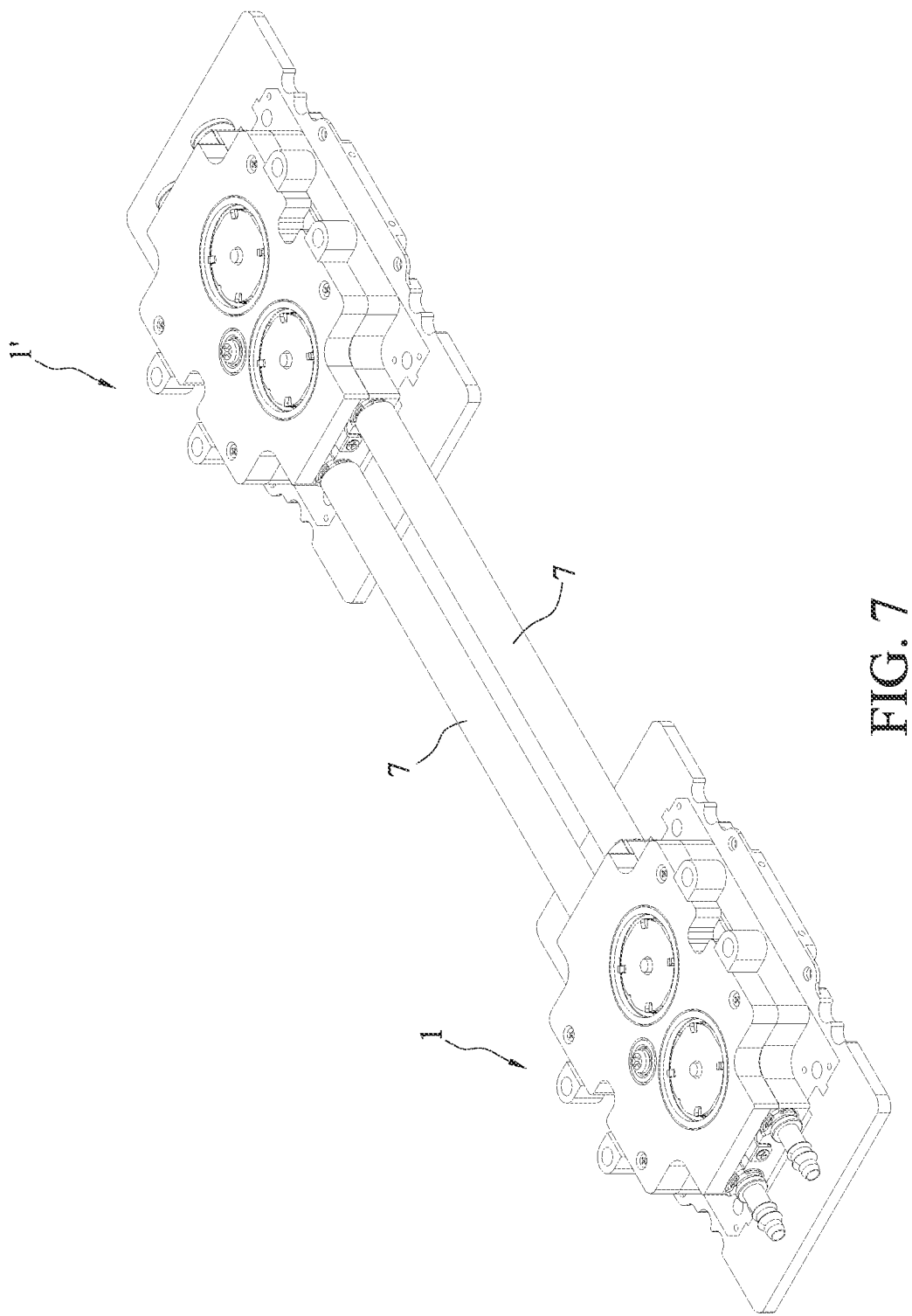
FIG. 7 is a schematic view depicting a plurality of cold plates connected in series in accordance with the present disclosure.
Figure 8:
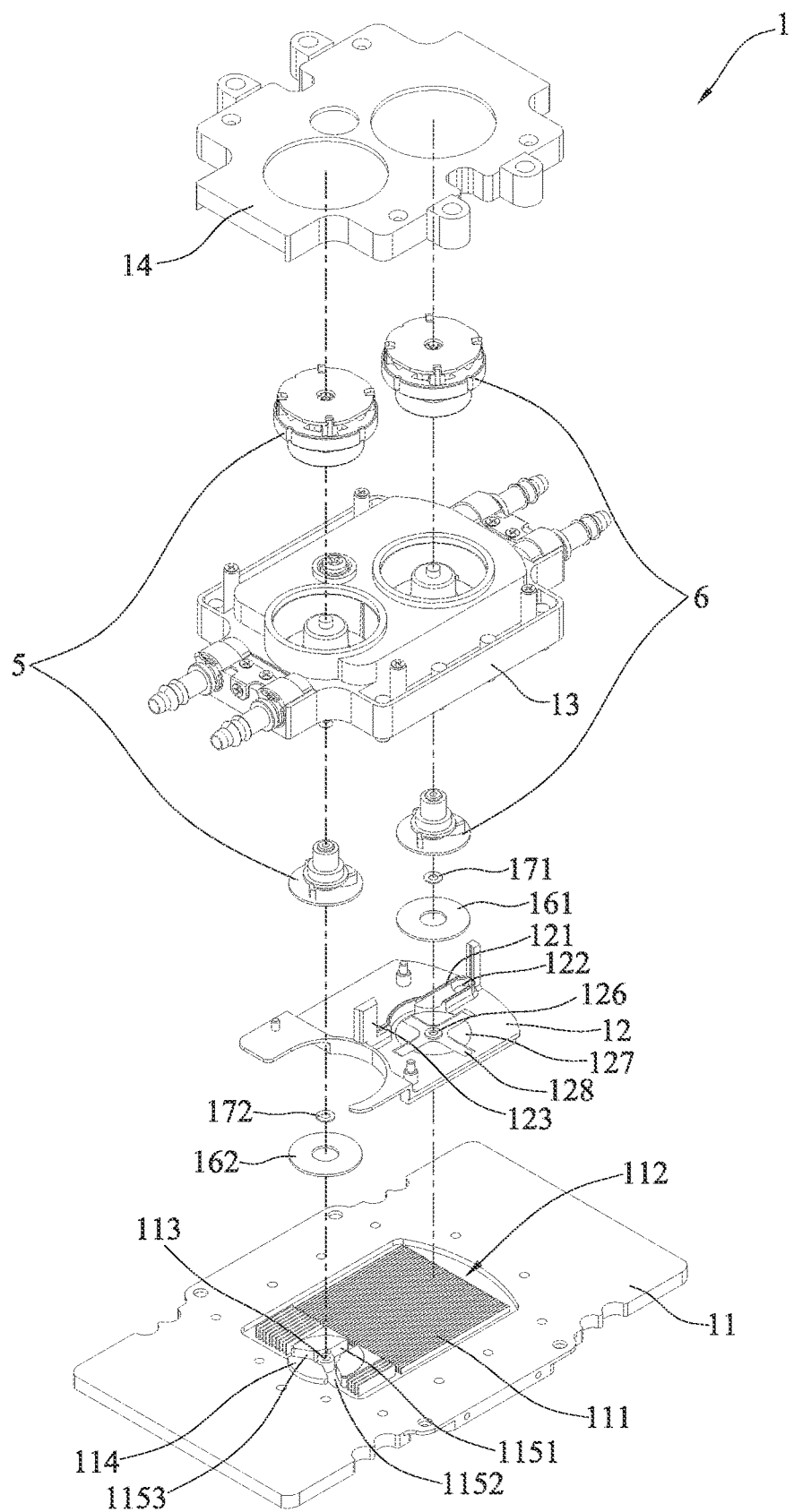
FIG. 8 is an exploded schematic view of yet another embodiment of the cold plate in accordance with the present disclosure.

Referring to FIGS. 7 to 9, in another embodiment of the present disclosure, two cold plates 1, 1' can be connected in series by a pipe 7, wherein the structural features of the cold plate 1' that are similar to or the same as the structural features of the cold plate 1 in the previous embodiment described with respect to FIG. 1A will not be described again. Only the differences are illustrated below.

Compared to the previous embodiment, the cold plate 1 of this embodiment is different in that a retaining wall 123 is further provided on the baffle 12. The retaining wall 123 can divide the chamber 3 into space 124 and space 125 that are not connected with each other. The pump 6, the diversion groove 121, the opening 122, the connecting portion 127 and the shaft fastening portion 126 are all arranged in the space 125. In addition, the retaining wall 123 can extend to one side of the diversion groove 121 and formed integrally with it.

Figure 10:
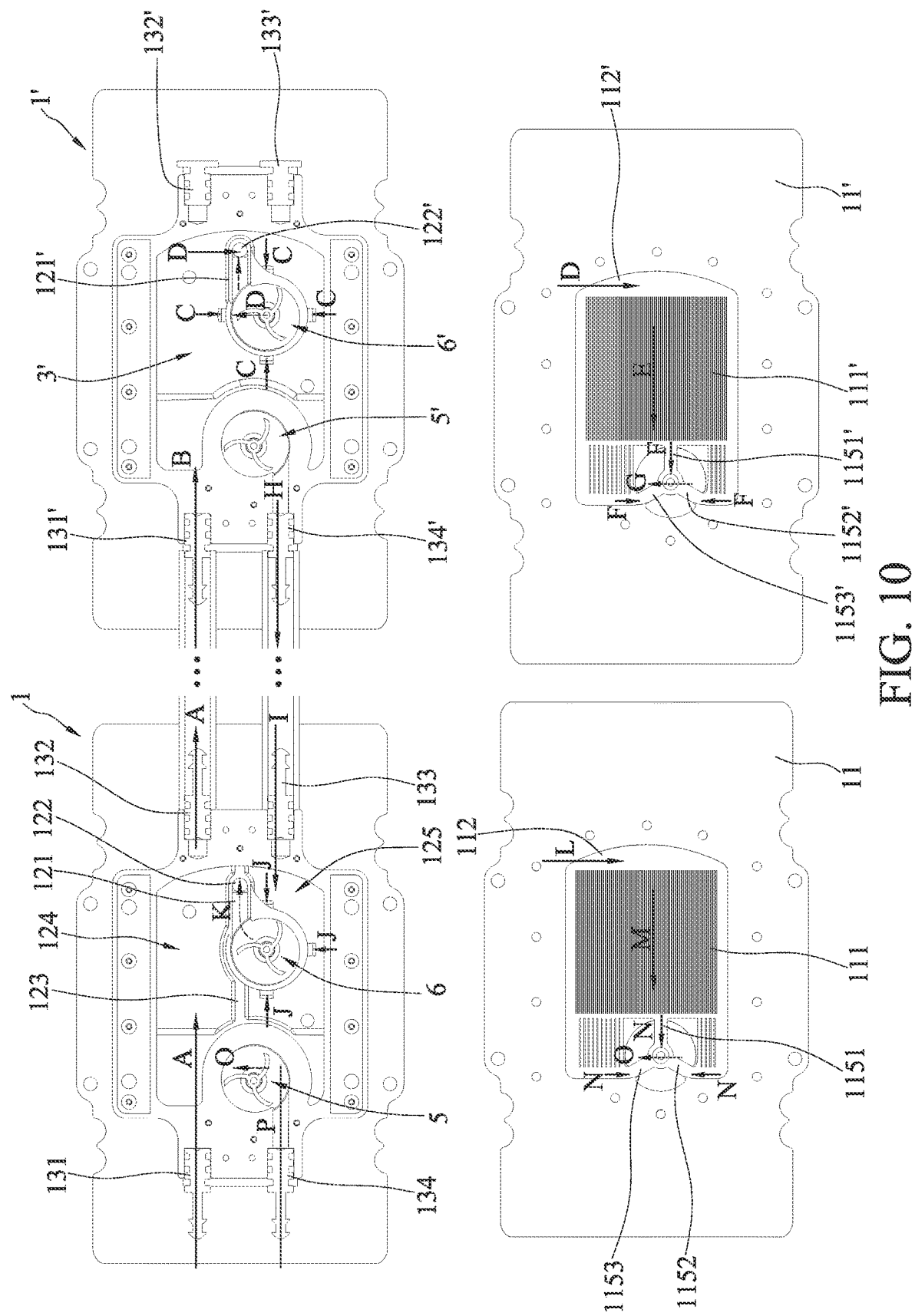
FIG. 10 is a schematic view depicting the flow of a coolant in the plurality of cold plates in FIG. 7.

Referring to FIG. 10, with the provision of the retaining wall 123 on the baffle 12 of the cold plate 1, after the working medium flows into the space 124 of the cold plate 1 through the channel 131 along the direction of an arrow A, the working medium, without the influence of the pump 6, then flows out of the cold plate 1 via the channel 132 along the direction of the arrow A and into the cold plate 1' from the channel 131' through the pipe 7 along the direction of an arrow B. Meanwhile, the channels 132' and 133' can be sealed off. Next, the working medium flows into the pump 6' along the directions of arrows C. Driven by the pump 6', the working medium is guided into the diversion groove 121', and flows into the recess 112' via the opening 122' (direction of an arrow D). Thereafter, the working medium passes through the inside of the heat transfer structure 111' along the direction of an arrow E while absorbing thermal energy absorbed by the heat transfer structure 111', and flows into the grooves 1151', 1152', 1153' along the directions of arrows F. Driven by the pump 5', the working medium is drawn upwards along the direction of an arrow G, and then discharged out of the cold plate 1' via the channel 134' along the direction of an arrow H, and travels through the pipe 7 back to the cold plate 1. Then, the working medium can flow from the channel 133 into the space 125 along the direction of an arrow I, and into the pump 6 along the directions of arrows J. Driven by the pump 6, the working medium flows into the diversion groove 121 along the direction of an arrow K, and reaches the recess 112 via the opening 122 along the direction of an arrow L. Thereafter, the working medium passes through the inside of the heat transfer structure 111 along the direction of an arrow M while absorbing thermal energy absorbed by the heat transfer structure 111, and flows into the grooves 1151, 1152, 1153 along the directions of arrows N. Finally, driven by the pump 5, the working medium is drawn upwards along the direction of an arrow O, and then discharged out of the cold plate 1 via the channel 134 along the direction of an arrow P for further cooling.

In summary, with the double-pump design in some of the embodiments of the cold plate of the present disclosure, not only the inflow water pressure of the heat transfer structure can be increased, but in the event of one pump stops functioning, the other pump can still operate to dissipate heat, reducing the probability of failure of the overall cold plate, thereby improving the heat dissipation capacity of the cold plate. In addition, the recess formed on the base allows the base level of the heat transfer structure to be lowered, such that the fins can be placed closer to the heat source to reduce the thermal resistance of the materials and improve heat transfer efficiency. In the case that the cold plates of the present disclosure are connected in series, the flowing direction of the coolant can be more accurately controlled by the design of the sealed-off pipes or the baffle having the retaining wall. Furthermore, the cold plate of the present disclosure optimizes the inflow water pressure of the heat transfer structure, prevents the entire cold plate from failing if one of the pumps stops working, and addresses the problem of the heat dissipation fins being located too far from the heat source.

The above embodiments are merely provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A cold plate, comprising:
   a housing provided with a chamber;
   a base combined with the housing to form a working space separated from the chamber and connected to the chamber and the working space via an interconnecting opening to allow a working medium to flow in the chamber and the working space;
   heat transfer fins disposed on an inner side of the base for transferring thermal energy created by a heat source in contact with an outer side of the base to the working medium in the working space;
   a first pump disposed in the working space for partitioning the working space into a heat absorption space and a drainage space and for driving the working medium to flow from the heat absorption space to the drainage space; and
   a second pump disposed in the chamber for driving the working medium to flow from the chamber to the heat absorption space via the interconnecting opening.

2. The cold plate of claim 1, further comprising a baffle disposed between the base and the housing for jointly forming the chamber with the housing, wherein the second pump is disposed on the baffle.

3. The cold plate of claim 2, wherein the baffle includes a diversion groove and the interconnecting opening, the diversion groove is formed on the baffle and one end of which is located at the tangent direction of an edge of the second pump, and the interconnecting opening is located at other end of the diversion groove and penetrates through the baffle.

4. The cold plate of claim 3, wherein the diversion groove is formed by sidewalls protruding from a surface of the baffle, or formed by a groove recessed into the surface of the baffle.

5. The cold plate of claim 3, wherein the baffle further includes a connecting portion and a shaft fastening portion on which the second pump is disposed, the shaft fastening portion is located at a center of the connecting portion for securing a shaft of the second pump, and the connecting portion includes a recessed cross-shaped groove for guiding the working medium.

6. The cold plate of claim 5, further comprising a ring piece provided between the second pump and the cross-shaped groove, wherein a portion of the cross-shaped groove is exposed from the ring piece and the connecting portion.

7. The cold plate of claim 6, further comprising a Mylar ring piece provided between the second pump and the shaft fastening portion, wherein the ring piece and the connecting portion are integrally formed.

8. The cold plate of claim 5, further comprising a retaining wall provided on the baffle to partition the chamber into at least two spaces, wherein the second pump, the diversion groove, the interconnecting opening, the connecting portion, and the shaft fastening portion are all located in one of the at least two spaces.

9. The cold plate of claim 5, wherein the housing further includes a pump chamber and a circular sidewall provided at periphery of the pump chamber, the pump chamber is configured for receiving the second pump, and the circular sidewall is configured for separating the pump chamber and the chamber and being fluidly connected with the cross-shaped groove and the diversion groove after the housing is combined with the baffle.

10. The cold plate of claim 1, wherein the base further includes a connecting portion and a shaft fastening portion on which the first pump is disposed, the shaft fastening portion is located at a center of the connecting portion for securing a shaft of the first pump, and the connecting portion includes a plurality of recessed grooves for guiding the working medium.

11. The cold plate of claim 10, wherein the plurality of grooves are arranged at equal angles, and one of the plurality of grooves extends in parallel with an extending direction of the heat transfer fins.

12. The cold plate of claim 10, further comprising a ring piece provided between the first pump and the plurality of grooves.

13. The cold plate of claim 12, further comprising a Mylar ring piece provided between the first pump and the shaft fastening portion, wherein the ring piece and the connecting portion are integrally formed and through which the plurality of grooves penetrate.

14. The cold plate of claim 1, further comprising a plurality of channels, wherein one of the plurality of channels is interconnected with the drainage space, while rest of the plurality of channels are interconnected with the chamber.

15. The cold plate of claim 1, wherein the interconnecting opening is correspondingly located at one end of the heat transfer fins, and the first pump is correspondingly located at other end of the heat transfer fins.

16. The cold plate of claim 1, further comprising a recess formed on the inner side of the base corresponding to periphery of the heat transfer fins, wherein the recess receives the working medium flowing through the interconnecting opening.

* * * * *